United States Patent [19]

Zimmermann

[11] Patent Number: 5,155,575
[45] Date of Patent: Oct. 13, 1992

[54] CHIP CARRIER FOR A MICROWAVE SEMICONDUCTOR COMPONENT

[75] Inventor: Walter Zimmermann, Dorfen, Fed. Rep. of Germany

[73] Assignee: Siemens Aktiengesellschaft, Munich, Fed. Rep. of Germany

[21] Appl. No.: 644,635

[22] Filed: Jan. 23, 1991

[30] Foreign Application Priority Data

Jan. 31, 1990 [EP] European Pat. Off. ........ 90101925.7

[51] Int. Cl.$^5$ .............................................. H01L 23/48
[52] U.S. Cl. ...................................... 357/68; 357/70; 357/72
[58] Field of Search ............... 357/68, 70, 72, 81, 357/74, 23.14

[56] References Cited

U.S. PATENT DOCUMENTS 4,446,375  5/1984  Aird ................................. 250/551
4,794,431 12/1988  Park ................................. 357/70

FOREIGN PATENT DOCUMENTS 0026788  9/1980  European Pat. Off.
0240985 11/1986  Fed. Rep. of Germany
57-93571   6/1982  Japan
59-172262  9/1984  Japan
62-274645 11/1987  Japan

OTHER PUBLICATIONS

Japan Patent Specifications, vol. 9, No. 263 (1986), Oct. 19, 1985, Kazuo Kanbayashi "Semiconductor Device".
Japan Patent Specifications, vol. 10, No. 268, Sep. 12, 1986, Seizo Akasaka, "High-Frequency Ground Structure of Semiconductor Chip".
Japan Patent Specifications, vol. 11, No. 108, Apr. 4, 1987, Tetsuo Mori "Microwave Transistor Device".
Japan Patent Specifications, vol. 12, No. 174, May 24, 1988, Yoshie Nomura, "High-Frequency Transistor".

Primary Examiner—Andrew J. James
Assistant Examiner—Viet Q. Nguyen
Attorney, Agent, or Firm—Hill, Van Santen, Steadman & Simpson

[57] ABSTRACT

A chip carrier for a microwave semiconductor component with four external electrical contacts has a favorable operating and application behavior, even when a plastic housing is used. Two external source terminals are connected with each other as one pieve via a cross member. The cross member basically proceeds obliquely to a transverse axis or to a longitudinal axis of the chip carrier.

21 Claims, 7 Drawing Sheets

CHIP CARRIER FOR A MICROWAVE SEMICONDUCTOR COMPONENT

BACKGROUND OF THE INVENTION

The invention involves a chip carrier for a microwave semiconductor component wherein four external electrical contacts are provided including two external source terminals, one external gate terminal, and one external drain terminal.

A chip carrier for microwave semiconductor components is for the purpose of permitting an encapsulation of the microwave semiconductor components which is suitable above 12 GHz, thereby preserving microwave-properties of the semiconductor component. The carrier also serves the purpose of maintaining stability (vibration prevention) and simultaneously largely suppressing feedback, overcoupling, and undefined impedances.

A chip carrier should be suitable for surface-mountable microwave semiconductor components.

A chip carrier should permit a favorable phase performance S11 as well as a favorable reaction behavior S12, and have small housing losses.

Even when a plastic housing is used, a chip carrier permits at least the same favorable properties as are achieved with a microwave semiconductor component in a ceramic housing.

SUMMARY OF THE INVENTION

The present invention is based on the object of specifying a chip carrier of the initially described type which permits favorable operating and application behavior, even when a plastic housing is used.

According to the invention, a chip carrier has at least first and second external source terminals, an external drain terminal, and an external source terminal. A first of the four source terminals and the external drain terminal are arranged on a first side of the chip carrier and a second of the source terminal and an external gate terminal are arranged on a second opposite side of the chip carrier. With respect to a geometric line running in a plan view across the chip carrier, the first external source terminal and the external drain terminal are on one side of the geometric line and the second external source terminal and the external gate terminal are on a second opposite side of the chip carrier. The first external source terminal and the second external source terminal are located on different sides of the geometric line. The first external source terminal is connected with the second external source terminal as one piece via a cross member. A region on the cross member is provided for fastening the semiconductor chip thereon. The cross member substantially proceeds obliquely relative to the geometric line.

The invention permits considerable improvements in the phase performance S11 as well as in the reaction behavior S12, and provides for low housing losses. The invention also permits the use of a plastic housing even above 12 GHz, thus permitting an operating and application behavior which can be achieved with a microwave semiconductor component in a ceramic housing, e.g. a CEREC-70.

A chip carrier according to the invention is particularly suitable for SMD (Surface mounted device) components. A chip carrier according to the invention is particularly suitable for a SOT143-component. A chip carrier according to the invention is in particular also suitable for a Mini-SOT-component.

A chip carrier according to the invention is suitable for the broadband matching circuits that are standard for CEREC-70-housings.

A chip carrier according to the invention can be designed such that it is PIN-compatible to the CEREC-70 housing.

A chip carrier according to the invention is particularly suitable for a HEMT (High electron mobility transistor) component. A chip carrier according to the invention is also suitable for other microwave components.

A chip carrier according to the invention results in a microwave component which reacts in an insensitive manner to user circuits, particularly to source-groundings, as they are provided by different pc board materials.

The diagonal ground cross member between the two external source electrodes permits, in the case of a chip carrier according to the invention, the shortest possible gate connection to the outside given the simultaneous accommodation of the source terminals. The geometric and electrical length between the external gate terminal and the semiconductor chip is advantageously reduced to a minimum. The gate terminals of the semiconductor chip are advantageously contacted in optimally short fashion, and if possible also in double contacted fashion. The source terminal of the semiconductor chip is advantageously contacted in a four-fold fashion, and likewise is contacted with optimally short bond wires. The gate electrode of the chip carrier is advantageously widened. An anchoring of the gate electrode and/or the drain electrode of the chip carrier in a plastic cover of the component by means of a hook and/or at least one breakthrough are advantageously designed such that there are no disadvantageous electrical effects.

The source negative feedback due to the cross member or web in the housing is low due to the low dielectric constant of the plastic material of the cover of the component. The inner coupling of the gate terminal and of the drain terminal of the component via the source cross member to the end capacitances that are low themselves is thus likewise low.

Advantageously, the gate electrode is cut in oblique fashion where it is directly adjacent to the cross member. Thus, a shorter running time of the microwaves results.

Advantageously, the gate electrode is cut in oblique fashion where it is directly adjacent to the cross member. Thus, a shorter running time of the microwaves results.

Advantageously, the gate electrode is as closely adjacent to the cross member as possible. Thus, end capacities, scattering, and tolerances for cutting tools must be taken into account, however. A parameter for a very small distance between the gate electrode and the cross member which, according to findings to date is appropriate, is approximately 0.1 mm.

The external contacts of the chip carrier advantageously are at an operating distance that is useful for the user so that no solder bridges between adjacent external contacts develop. A suitable parameter for such a distance between two adjacent external contacts is, for example, 0.6 mm. Given an increasing miniaturization, these distances between adjacent external contacts can be decreased.

A mini-SOT-housing has a shorter plastic body than a SOT143-housing (in longitudinal direction). Even for such a plastic body, a chip carrier according to the invention can be used. When the semiconductor chip is placed obliquely to the longitudinal axis or the transverse axis of the chip carrier, the path from the gate electrode to the semiconductor chip gate terminal can be shortened. Thus, a shorter length of the contacting wires is possible.

A component with a chip carrier according to the invention is user-friendly and permits a low phase rotation from the external gate terminal and drain terminal to the semiconductor chip.

In a simple manner, a chip carrier according to the invention permits a four-fold contacting between the semiconductor chip and the source electrode. A chip carrier according to the invention permits in a simple manner a two-fold contacting between the semiconductor chip and the drain electrode. A chip carrier according to the invention permits in a simple manner a two-fold contacting between semiconductor chip and gate electrode.

A chip carrier according to the invention gives better results for a HEMT than a ceramic housing. In adaptability, a chip carrier according to the invention can be at least compared to a ceramic housing.

Advantageously, the external gate terminal is wider than the external drain terminal. A favorable value for the width of the external gate terminal lies between approximately 0.5 mm and 0.8 mm.

Advantageously, the drain electrode is arranged as close to the cross member as possible in the direction toward the semiconductor chip. Thus, short contacting wires and a short path for the microwaves are provided.

The drain electrode can be contacted in single or double fashion. The gate electrode can be contacted in single, double, or four-fold fashion. The source electrode can be contacted in single, double, or four-fold fashion.

The connection between the semiconductor chip and the gate electrode is advantageously as short as possible. The connection between the semiconductor chip and the gate electrode is advantageously guided in low-ohmic fashion according to the wave impedance to the external housing terminal.

For the anchoring of the gate electrode or the drain electrode in a covering for the microwave component to be applied at a later time, advantageously noses and-/or breakthroughs in the respective electrodes are provided. From this results a good mechanically stable anchoring of these electrodes in the plastic body of the component.

A microwave component with a chip carrier according to the invention is SMD-capable. Such a SMD-microwave component with such a SMD-housing fulfills microwave properties at least in a satisfactory manner.

The different terminals (pads) on the semiconductor chip for source, drain, and gate can be arranged on this semiconductor chip in any way. Thus, even given a straight arrangement of the semiconductor chip relative to the longitudinal axis or the transverse axis of the chip carrier, favorable microwave properties are achieved.

A microwave component with a chip carrier according to the invention has favorable four-pole-S-parameters. A microwave component with a chip carrier according to the invention has a small phase rotation at S11. A microwave component with a chip carrier according to the invention has a phase of almost 180°.

Advantageously, the semiconductor chip is arranged on the cross member as close as possible to the gate electrode.

DESCRIPTION OF THE PREFERRED EMBODIMENTS

FIGS. 1 to 7 explain various chip carriers or microwave components with a chip carrier. The same parts are thus provided with the same reference symbols. In the drawing, only chip carriers with four external electrical terminals are shown. The invention is also suitable, however, for chip carriers with more than four external electrical terminals, e.g. for a MMIC-microwave component. A chip carrier according to the drawing has one external gate terminal 1, two external source terminals 2, 3 and one external drain terminal 4. The external gate terminal 1 and one external source terminal 2 are alongside of the chip carrier. The other external source terminal 3 and the external drain terminal 4 are located on an opposite side of the chip carrier. The chip carrier has a longitudinal axis 11 and a transverse axis 14. The two external source terminals 2, 3 are located on opposite sides of the longitudinal axis 11 as well as on opposite sides of the transverse axis 14. The axis 14 of the chip carrier defines a geometric line proceeding on one side of the carrier between the external gate terminal 1 and the external source terminal 2 and, on the opposite side of the chip carrier, between the other external source terminal 3 and the external drain terminal 4. The two external source terminals 2, 3 are connected as one piece via the cross member 5. The cross member 5 basically proceeds obliquely to the axis (geometric line) 14. Within the cross member 5, a center line can be defined which connects the center line of the external source terminal 2 with the center line of the external source terminal 3. This center line 7 within the cross member 5 basically proceeds obliquely to the axis (geometric line) 14. It is favorable when the cross member 5 proceeds essentially at an angle of 45° to the axis (geometric line) 14. The contacting wires between the semiconductor chip 6 and the gate electrode are to be as short as possible. For this reason, the gate electrode has an oblique border 10 where it is the most closely adjacent to the cross member 5. This oblique bordering 10 favorably proceeds likewise at an angle of 45° to the axis (geometrical line) 14. The semiconductor chip 6 is likewise arranged in oblique fashion relative to the axis (geometrical line) 14. The semiconductor chip 6 is as closely adjacent to the gate electrode as possible. The axes of the semiconductor chip are at an angle of 45° to the axis (geometric line) 14. Also the drain electrode is closely adjacent to the cross member 5. The drain electrode, too, has a border 9 where it is most closely adjacent to the cross member, this border proceeding obliquely to the axis (geometric line) 14.

A microwave component with a chip carrier is provided with a covering 8. The covering 8 can correspond to the covering of a SOT143-housing. When the covering 8 corresponding to the covering of a SOT143-housing is shortened on both ends (relative to the axis 11), one obtains the covering of a mini-SOT-housing.

The external gate terminal 1 is constructed wider than the external drain terminal 4. In order to permit a mechanically stable anchoring of the chip carrier in the covering 8, and in order to avoid electrical disadvantages, the gate electrode has a breakthrough 13 and a nose 12, and the drain electrode also has a nose 12.

In the exemplary embodiment, the external gate terminal 1 has a width of 0.7 mm and the external drain terminal 4 has a width of 0.4 mm. The external gate terminal has a distance to the external source terminal 2 of 0.6 mm. The gate electrode has a distance to the cross member 5 along the border 10 of 0.15 mm. The border of the gate electrode adjacent to the axis 11 has a distance of 0.45 mm to the border of the covering 8. The border of the drain electrode that is most closely adjacent to the axis 11 has a distance of 0.4 mm to the edge of the covering 8.

Figure 1:
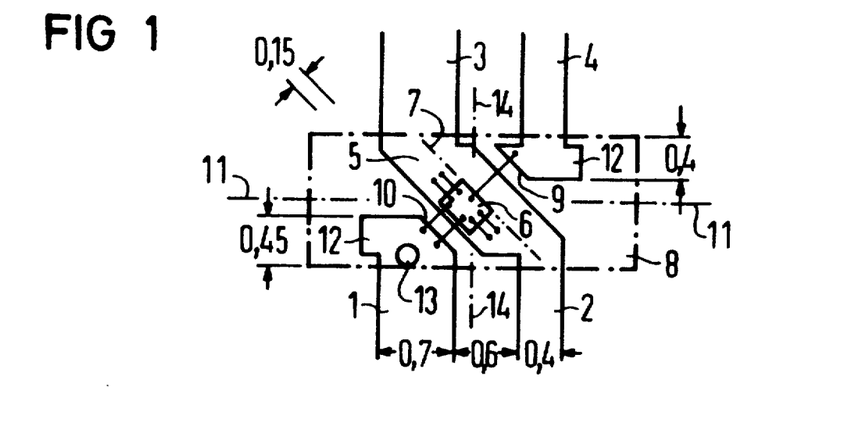
FIGS. 1 to 7 explain various embodiments of a chip carrier according to the invention, or of a microwave component with a chip carrier according to the invention.
Figure 2:
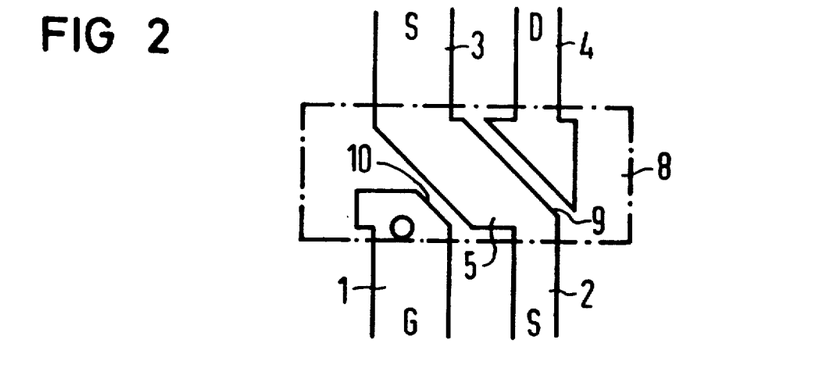
Figure 3:
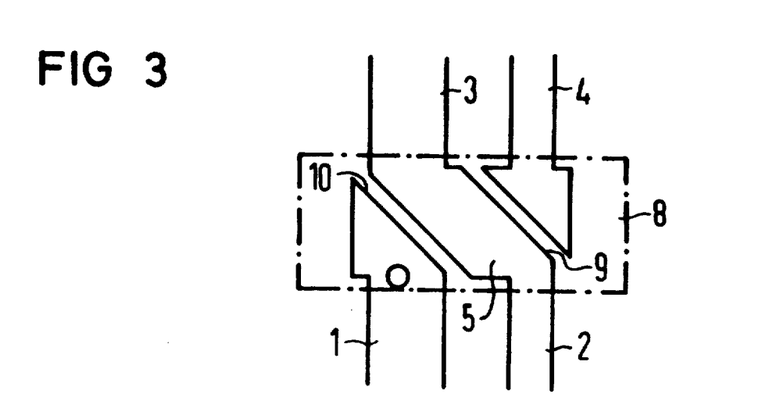
Figure 4:
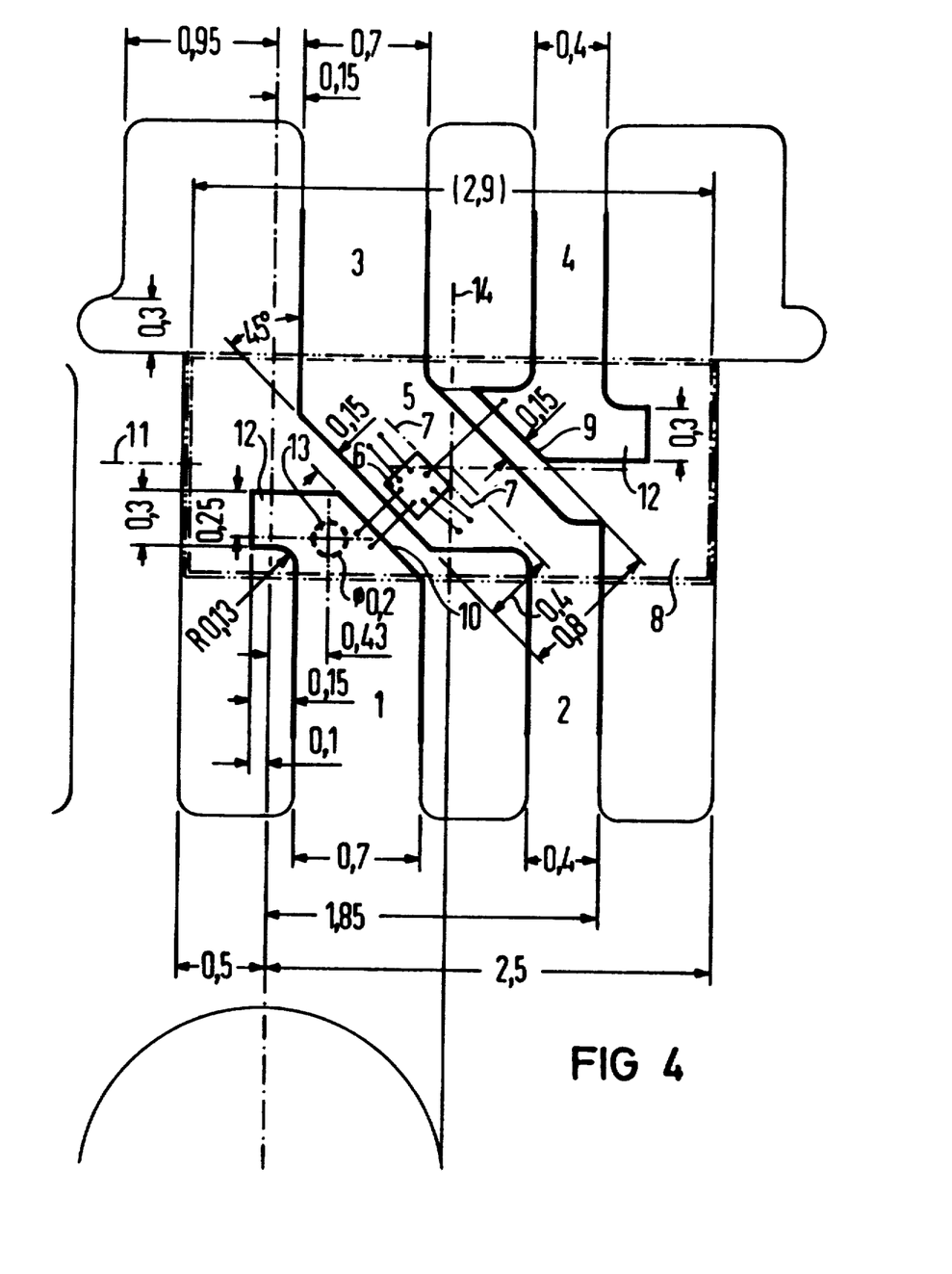

FIG. 4 shows a chip carrier whereby the borders of the gate electrode, the drain electrode, and of the cross member 5 have been optimized. Thus, it is not necessary that the opposite borders of the cross member 5, for example, proceed in parallel fashion to one another. It suffices when the cross member 5 proceeds basically obliquely to the axis (geometric line) 14.

Figure 5:
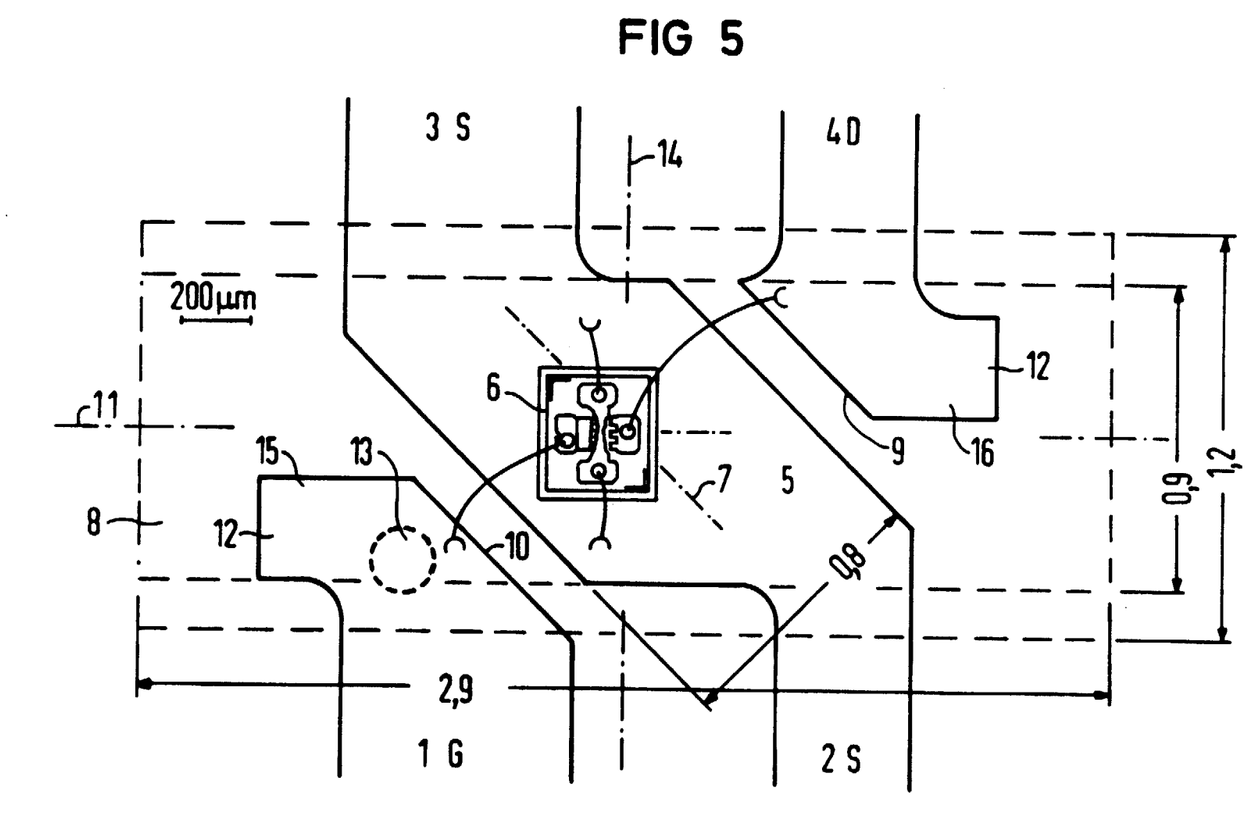
Figure 6:
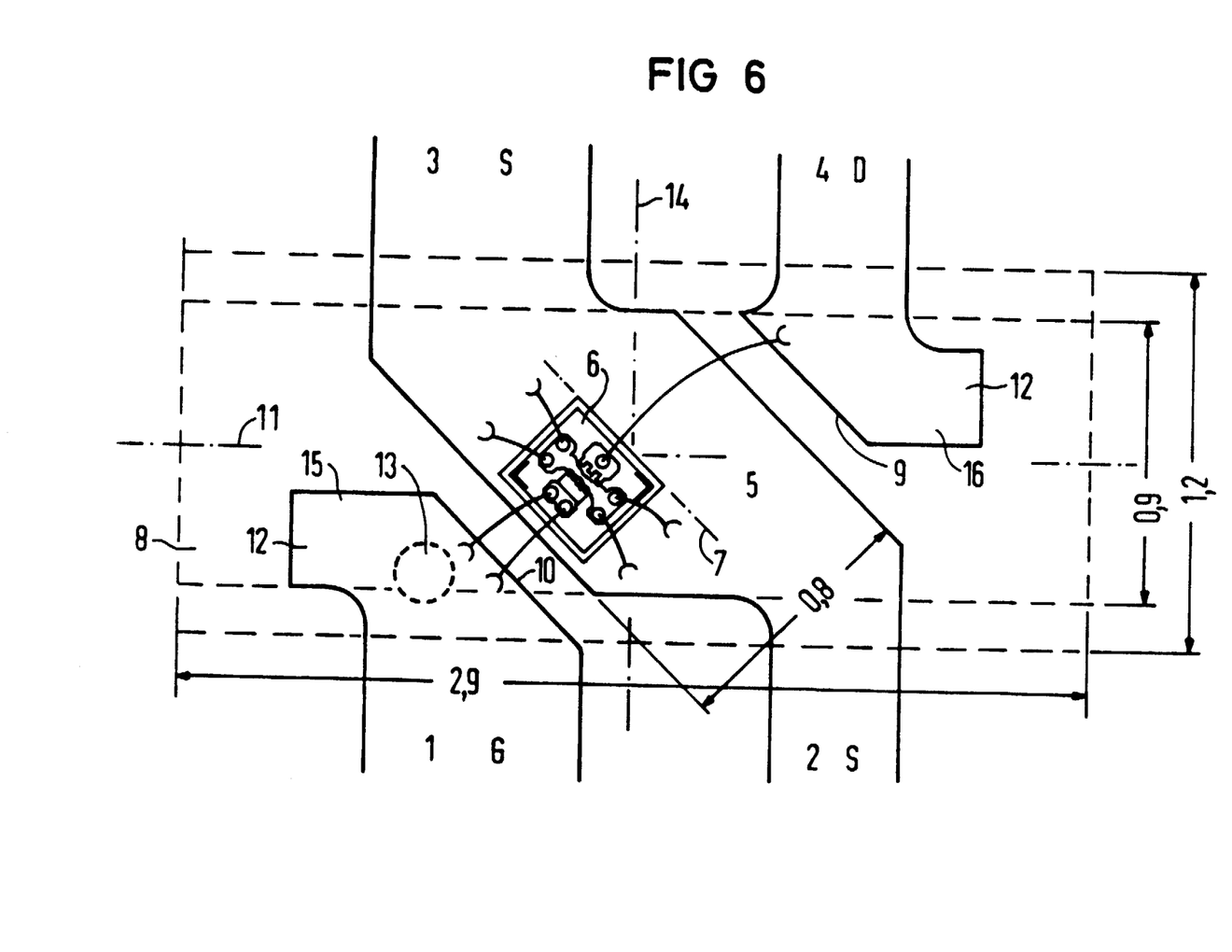

FIG. 5 shows a microwave component with a chip carrier whereby the semiconductor chip 6 is arranged such that its edges proceed in parallel fashion to the axes 11, 14. Such a microwave component is useful, for example, for an application at 8 GHz. For an application at higher frequencies, e.g. at 12 GHz, an oblique arrangement of the semiconductor chip 6 relative to the axes 11, 14 according to FIG. 6 is to be preferred.

Figure 7:
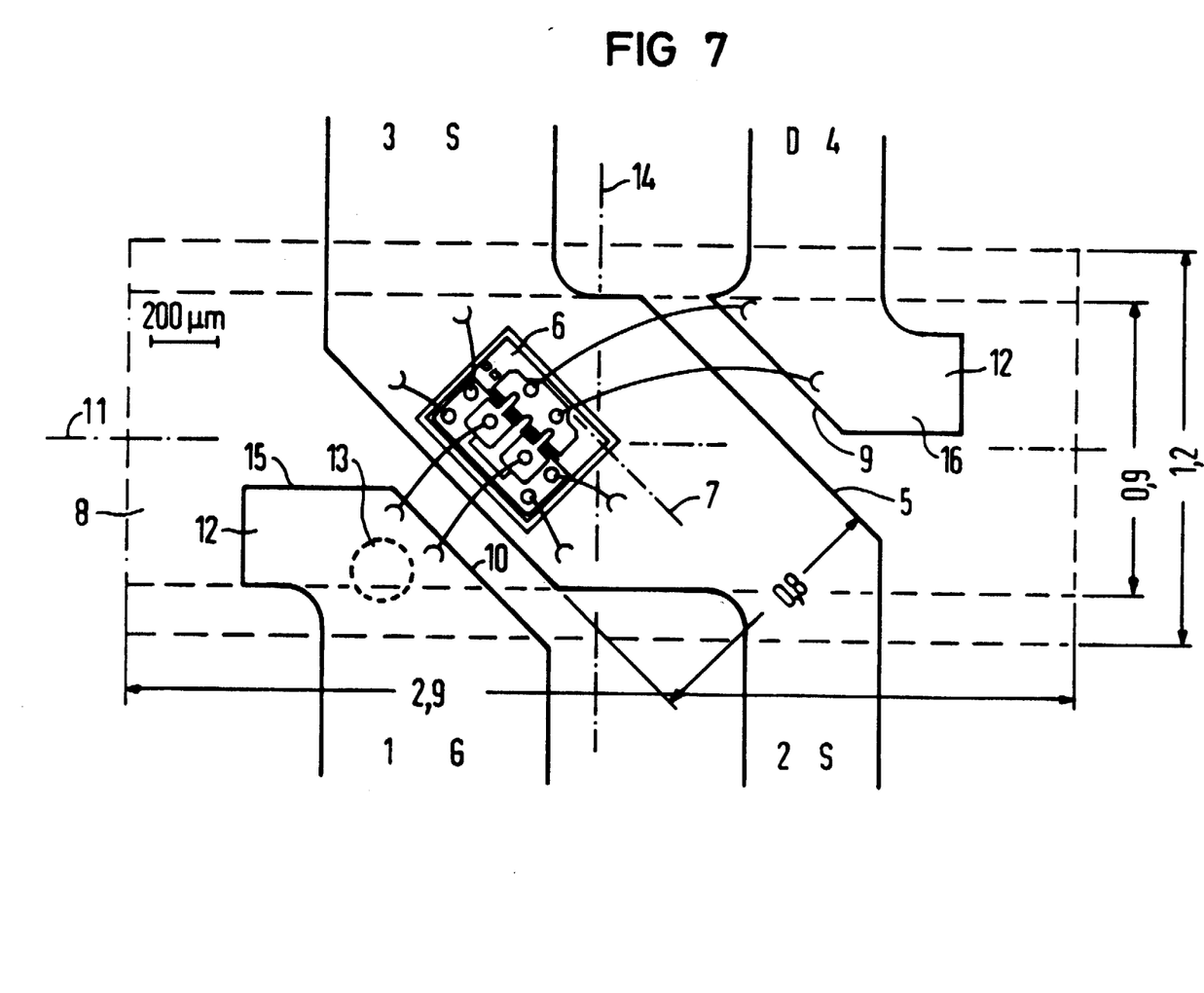

FIG. 7 shows a microwave component with a chip carrier whereby the semiconductor chip 6 is arranged in oblique fashion relative to the axes 11, 14. The semiconductor chip 6 is contacted in double fashion with the gate electrode, in double fashion with the drain electrode, and in four-fold fashion with the source electrode.

A comparison of FIG. 4 with FIG. 7 shows that in the case of a microwave component according to FIG. 4, the contacting wires between the gate electrode and the semiconductor chip 6, and between the semiconductor chip 6 and the drain electrode, are shorter than in the case of a microwave component according to FIG. 7.

Figure 8:
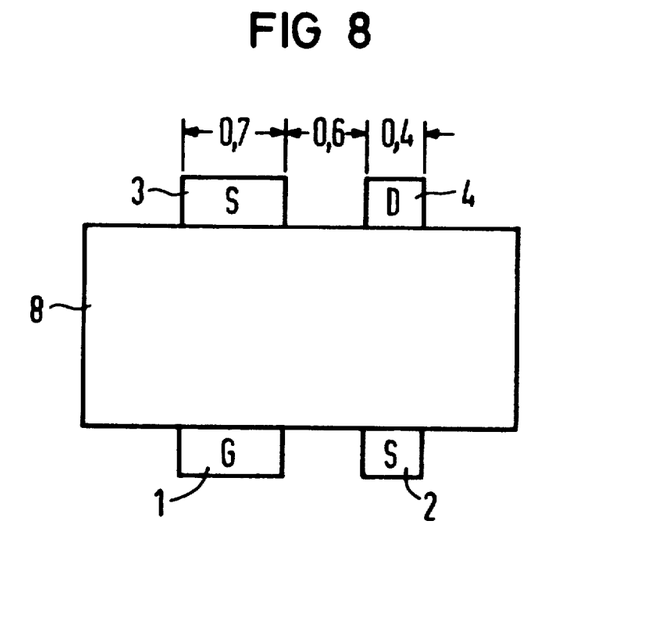
FIG. 8 shows a SMD-microwave component with a chip carrier according to the invention.

FIG. 8 shows the outside dimensions of a 12 GHz-GaAs-microwave component in a SMD-plastic housing. When used for a HEMT given a frequency of 12 GHz, a voltage VDS of 2 V, and a current ID of 12 mA, one obtains a noise factor F/dB/type of 1.3 and a gain at noise matching Gass/dB/type of 10.5. Using a microwave component with a chip carrier for a GaAs-field effect transistor given a frequency of 12 GHz, a voltage VDS of 3 V, and 5 mA results in a noise factor F/dB/type of 1.8 and a gain at noise matching Gass/dB/type of 8.5.

Figure 9:
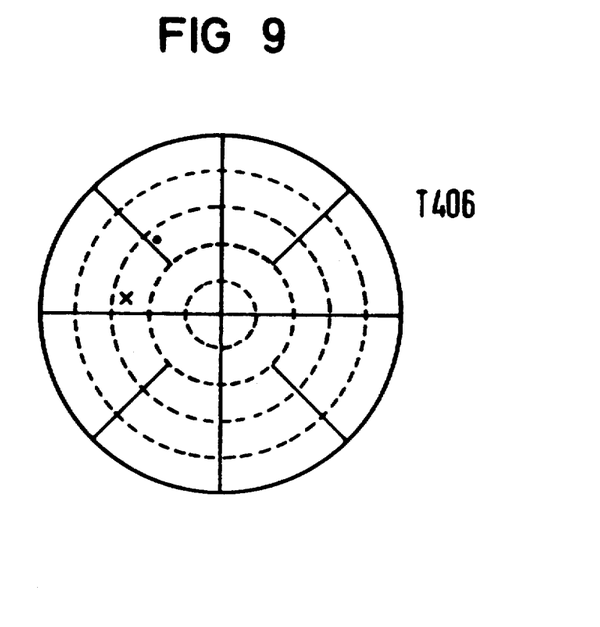
FIG. 9 shows phase behavior S11 of a microwave component with a chip carrier according to the invention.

FIG. 9 shows the phase performance S11 of a microwave component with a chip carrier with a plastic cover in a SOT143-housing at a frequency of 12 GHz. There, the semiconductor chip is contacted in four-fold fashion with the source electrode. The point shows the value for the phase performance S11 given a single contacting of the semiconductor chip with the gate electrode. The cross shows the value for the phase performance S11 given a double contacting of the semiconductor chip with the gate electrode.

Figure 10:
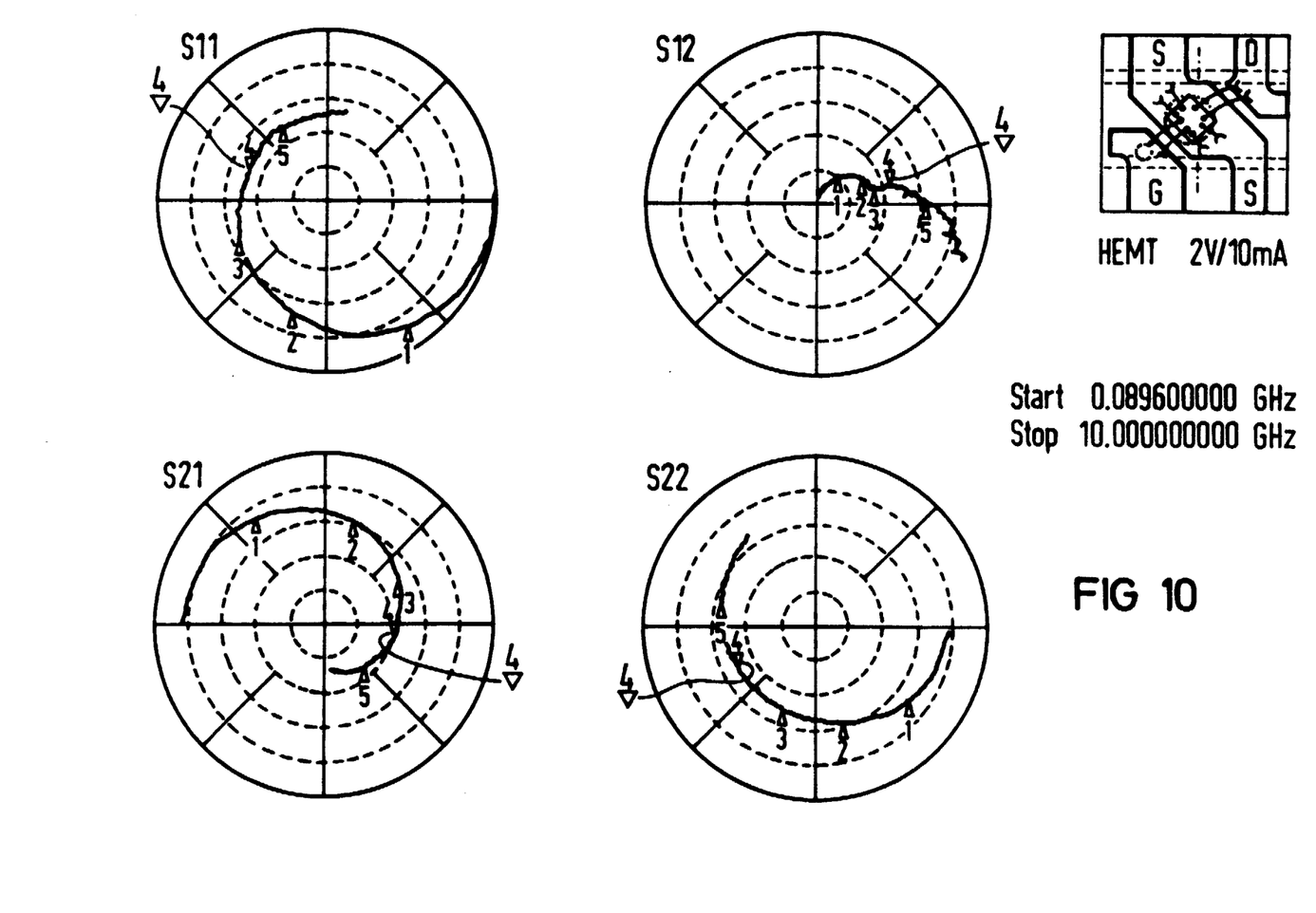
FIG. 10 shows the four-pole-S-parameters for a microwave component with a chip carrier according to the invention.

FIG. 10 shows the different four-pole-S-parameters for a microwave component with a chip carrier whereby a HEMT as the semiconductor chip is contacted in four-fold fashion with the source electrode, in double fashion with the drain electrode, and in double fashion with the gate electrode. The marking with the number 4 thereby corresponds to a frequency of 12 GHz.

A chip carrier according to the invention can be modified in many ways. For example, the entire chip carrier can be laterally reversed relative to the axis 11. Then, the external terminals 1 and 3, and the external terminals 2 and 4, are respectively exchanged with one another. For example, the entire chip carrier can be laterally reversed relative to the axis 14. Then, the external terminals 1 and 2 and the external terminals 3 and 4 are respectively exchanged with one another. Also, the borders of the cross member 5, and/or the gate electrode 15, and/or the drain electrode 16 can be varied, for example.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor component assembly, comprising:
    a semiconductor chip having at least first and second source contacts, a gate contact, and a drain contact;
    a chip carrier assembly having the semiconductor chip located at a contacting region thereof, a first external source terminal, a second external source terminal, an external gate terminal, and an external drain terminal extending into the contacting region, and a protective sealing surrounding the contacting region and portions of the first and second source terminals, gate terminal, and drain terminal in the contacting region;
    respective contact means connecting the first and second source contacts and gate and drain contacts of the semiconductor chip to the respective first and second external source terminals, external gate terminal, and external drain terminal;
    the first source terminal and gate terminal extending outwardly from the contacting region at a first side thereof and a drain terminal and second source terminal extending outwardly from the contacting region at an opposite second side thereof;
    the first source terminal and the drain terminal lying at a first side of a geometric line and the gate terminal and the second source terminal lysing at an opposite side of said geometric line;
    the first external source terminal and second external source terminal being connected via a web-like cross member passing through the contacting region and wherein said semiconductor chip is fastened on the cross member; and the cross member and opposite side edges thereof proceeding substantially obliquely to said geometric line.

2. An assembly according to claim 1 wherein the protective sealing is substantially rectangular, and said geometric line being transverse to first and second opposite sides of the protective sealing.

3. An assembly according to claim 1 wherein the protective sealing comprises plastic and the semiconductor chip is a microwave component.

4. An assembly according to claim 1 wherein the protective sealing comprises a rectangular housing having first and second opposite sides, said first source terminal and said first gate terminal extending outwardly from said first side and said drain terminal and said second source terminal extending outwardly from said opposite second side, and wherein said geometric line is transverse to said first and second opposite sides of said protective sealing.

5. A chip carrier assembly for a microwave semiconductor chip, comprising:
- at least four external electrical contacts comprising first and second external source terminals, an external gate terminal, and an external drain terminal;
- the first source terminal and the gate terminal being arranged on a first side of the chip carrier, and the second source terminal and the drain terminal being arranged on an opposite second side of the chip carrier;
- in a plan view of the chip carrier the terminals being arranged such that a geometric line can be arranged between the first external source terminal and gate terminal at the first side of the chip carrier and such that said geometric line also proceeds between the second source terminal and the drain terminal at the second opposite side of the chip carrier, the first source terminal and the second source terminal being located on different sides of said geometric line;
- the first source terminal being connected with the second source terminal as one piece via a cross member, and a region being provided on said cross member at which a semiconductor chip can be fastened; and
- said cross member and substantially parallel and opposite side edges thereof proceeding substantially obliquely to said geometric line, and wherein said gate terminal has a border which is also oblique to said geometric line and substantially parallel to the cross member side edge which is directly adjacent to said border.

6. A chip carrier assembly according to claim 5 wherein two of the external contacts are arranged at each of first and second opposite longitudinal sides of the chip carrier, and wherein said geometric line proceeds transversely relative to an axis of the chip carrier between these first and second sides.

7. A chip carrier assembly according to claim 5 wherein a center line extending longitudinally along the cross member cuts said geometric line in oblique fashion.

8. A chip carrier assembly according to claim 5 wherein said cross member extends longitudinally substantially at an angle of 45° to said geometric line.

9. A chip carrier assembly according to claim 5 wherein said region for fastening the semiconductor chip defines a space which is rectangular in shape and wherein sides of the rectangle are oblique to said geometric line.

10. A chip carrier assembly according to claim 5 wherein the drain and gate terminals have electrode portions directly adjacent to sides of the cross member.

11. A chip carrier assembly according to claim 10 wherein a border of the drain electrode portion directly adjacent and closest to the cross member proceed obliquely to said geometric line.

12. A chip carrier assembly according to claim 10 wherein said oblique border of the gate electrode portion is directly adjacent and closest to the cross member.

13. A chip carrier assembly according to claim 10 wherein the chip carrier assembly has a protective sealing and wherein at least one of said gate and drain electrode portions has means for stable anchoring to the protective sealing.

14. A chip carrier assembly according to claim 10 wherein the semiconductor chip is connected via two bonding wires with the gate electrode portion.

15. A chip carrier assembly according to claim 10 wherein the semiconductor chip is connected via two bonding wires with the drain electrode portion.

16. A chip carrier assembly according to claim 10 wherein the gate electrode portion is contacted in double fashion.

17. A chip carrier assembly according to claim 10 wherein the source electrode portion is contacted in four-fold fashion.

18. A chip carrier assembly according to claim 10 wherein the drain electrode portion is contacted in double fashion.

19. A chip carrier assembly according to claim 5 wherein the semiconductor chip is connected with the cross member via four bonding wires.

20. A chip carrier assembly according to claim 5 wherein the semiconductor chip has a rectangular shape and wherein sides of the rectangle are arranged obliquely to the geometric line.

21. A microwave semiconductor component assembly, comprising:
- a semiconductor chip having at least first and second source contacts, a gate contact, and a drain contact;
- a chip carrier assembly having the semiconductor chip located at a contacting region thereof, a first external source terminal, a second external source terminal, an external gate terminal, and an external drain terminal extending into the contacting region, and a protective sealing surrounding the contacting region and portions of the first and second source terminals, gate terminal, and drain terminal in the contacting region;
- respective contact means connecting the first and second source contacts and gate and drain contacts of the semiconductor chip to the respective first and second external source terminals, external gate terminal, and external drain terminals,
- the first source terminal and gate terminal extending outwardly from the contacting region at a first side thereof and a drain terminal and second source terminal extending outwardly from the contacting region at an opposite second side thereof;
- the first source terminal and the drain terminal lying at a first side of a geometric line and the gate terminal and the second source terminal lysing at an opposite side of said geometric line;

the first external source terminal and second external source terminal being connected as one piece via a cross member passing through the contacting region and wherein said semiconductor chip is fastened on the cross member;

the cross member and opposite side edges thereof proceeding substantially obliquely to said geometric line; and the oblique sides of the cross member and placements of the drain terminal and gate terminal at respective spacings which are relatively close to the respective oblique sides of the semiconductor chip being selected to permit operation of the assembly above 12 GHz.

* * * * *